(12) United States Patent
Sammoura et al.

(10) Patent No.: US 8,215,151 B2
(45) Date of Patent: Jul. 10, 2012

(54) MEMS STICTION TESTING APPARATUS AND METHOD

(75) Inventors: Firas N. Sammoura, Melrose, MA (US); William Sawyer, Arlington, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 470 days.

(21) Appl. No.: 12/490,573

(22) Filed: Jun. 24, 2009

(65) Prior Publication Data

US 2009/0320557 A1    Dec. 31, 2009

Related U.S. Application Data

(60) Provisional application No. 61/075,795, filed on Jun. 26, 2008.

(51) Int. Cl.
*G01P 21/00* (2006.01)
(52) U.S. Cl. .......................... 73/1.38; 324/548
(58) Field of Classification Search ............. 73/1.38, 73/1.39, 9, 104, 514.32; 324/548
See application file for complete search history.

(56) References Cited

U.S. PATENT DOCUMENTS

| | | | | |
|---|---|---|---|---|
| 5,351,519 A * | 10/1994 | Kress | ............ | 73/1.39 |
| 5,635,640 A | 6/1997 | Geen | ............ | 73/504.12 |
| 5,939,633 A | 8/1999 | Judy | ............ | 73/514.32 |
| 6,002,259 A * | 12/1999 | Griffin et al. | ............ | 324/456 |
| 6,323,550 B1 | 11/2001 | Martin et al. | ............ | 257/704 |
| 6,446,486 B1 * | 9/2002 | deBoer et al. | ............ | 73/9 |
| 6,505,511 B1 | 1/2003 | Geen et al. | ............ | 73/504.12 |
| 6,625,345 B2 | 9/2003 | Reznichenko | ............ | 385/18 |
| 6,713,829 B1 | 3/2004 | Karpman | ............ | 257/415 |
| 6,877,374 B2 | 4/2005 | Geen | ............ | 73/504.14 |
| 6,892,576 B2 | 5/2005 | Samuels et al. | ............ | 73/514.32 |
| 6,940,636 B2 | 9/2005 | Felton | ............ | 359/298 |
| 7,098,644 B1 | 8/2006 | Denison | ............ | 324/72.5 |
| 7,416,984 B2 | 8/2008 | Martin et al. | ............ | 438/691 |
| 7,421,897 B2 | 9/2008 | Geen et al. | ............ | 73/504.12 |
| 7,458,263 B2 | 12/2008 | Nasiri et al. | ............ | 73/504.12 |
| 8,027,800 B2 * | 9/2011 | Nachman et al. | ............ | 702/117 |
| 2006/0237806 A1 | 10/2006 | Martin et al. | ............ | 257/415 |
| 2007/0090902 A1 * | 4/2007 | Deligianni et al. | ............ | 335/78 |
| 2008/0264181 A1 | 10/2008 | Sulouff et al. | ............ | 73/861.42 |

OTHER PUBLICATIONS

Walraven, "Failure Mechanisms in MEMS," IEEE, International Test Conference, pp. 828-833, (2003).

* cited by examiner

*Primary Examiner* — John Chapman, Jr.
(74) *Attorney, Agent, or Firm* — Sunstein Kann Murphy & Timbers LLP

(57) ABSTRACT

A MEMS stiction testing method applies a first electrical signal to a MEMS device having two opposing surfaces to cause the two opposing surfaces to make physical contact. The two opposing surfaces produce a second electrical signal when in physical contact. The method then substantially mitigates the first electrical signal after detecting that the second electrical signal has reached a prescribed maximum value.

18 Claims, 7 Drawing Sheets

MEMS STICTION TESTING APPARATUS AND METHOD

CROSS-REFERENCE TO RELATED APPLICATION

This patent application claims the benefit of U.S. Provisional Patent Application No. 61/075,795 entitled MEMS STICTION TESTING APPARATUS AND METHOD filed on Jun. 26, 2008, which is hereby incorporated herein by reference in its entirety.

FIELD OF THE INVENTION

The invention generally relates to MEMS devices and, more particularly, the invention relates to stiction in MEMS devices.

BACKGROUND OF THE INVENTION

Semiconductor technologies often form extremely clean microstructure surfaces on microelectromechanical devices (often referred to as "MEMS devices"). Undesirably, extremely clean microstructure surfaces often stick together if they come into contact. When the surfaces remain stuck together, the device often is inoperable. This concept of surface sticking is known in the art as "stiction."

A number of different factors can contribute to stiction. For example, among other things, stiction may occur during wet release of a movable MEMS microstructure, where the surface tension of a draining rinse liquid can draw the microstructure into contact with an adjacent part such as an underlying substrate (sometimes referred to as "release stiction"). Stiction also may occur when the device is in use, for example, when parts intentionally or accidentally come into contact with one another (sometimes referred to as "in-use stiction"). Stiction can be caused, for example, by capillary, electrostatic and van der Waals forces as well as by "chemical" forces such as hydrogen bonding and solid bridging. In some cases, stiction can be mitigated to some degree by coating the relevant MEMS parts with an anti-stiction material, although stiction may still occur.

Accordingly, prior to distribution of a MEMS device, MEMS device manufacturers often perform a variety of tests to determine the potential for stiction problems. Many currently available MEMS device stiction tests, however, have significant limitations. For example, some known stiction tests (which, of course, are not used during actual use of the MEMS device) in fact cause the stiction problem. Consequently, in addition to destroying the MEMS device, such tests do not accurately determine if a stiction problem actually exists. Other tests are not usable with certain types of MEMS devices. For example, some stiction tests are not usable with MEMS devices having springs with a high spring constant.

SUMMARY OF THE INVENTION

In accordance with one aspect of the invention, a MEMS stiction testing method applies a first electrical signal to a MEMS device having two opposing surfaces to cause the two opposing surfaces to make physical contact. The two opposing surfaces produce a second electrical signal when in physical contact. The method then substantially mitigates the first electrical signal after detecting that the second electrical signal has reached a prescribed maximum value.

To substantially mitigate the first electrical signal, the method may completely turn off the first electrical signal, or reduce it to a very low value. Moreover, the method may monitor the second electrical signal to determine when the first electrical signal should be mitigated.

Among other things, the first electrical signal may be a voltage, while the second electrical signal may be a current. The prescribed maximum value may be between about 300 and 700 pico-amps. As another example, the two opposing surfaces may form a variable capacitor, where the first signal is a voltage between the surfaces and the second signal is a current between the surfaces (when in contact). The method may measure the capacitance between the two opposing surfaces after substantially mitigating the first electrical signal, for example, to evaluate the likelihood that a stiction problem exists. Additionally or alternatively, the method may measure the capacitance between the two opposing surfaces before applying the first electrical signal and may compare the two capacitance measurements, for example, to evaluate whether there was a substantial change in capacitance from before stiction testing to after stiction testing.

This method may be performed on a number of different types of MEMS devices. For example, the MEMS device may include a high-G MEMS inertial sensor, a low-G MEMS inertial sensor, and/or a MEMS microphone, to name but a few. In some embodiments, the method applies the first signal to the MEMS device in a stepped manner. In a similar manner, some embodiments substantially mitigate by reducing the first signal in a stepped manner. In that case, the opposed surfaces may separate at a given voltage while reducing the first signal, and the method may further involve monitoring the second electrical signal to detect when the second electrical signal has reached a prescribed value indicative of surface separation and/or recording the given voltage.

In accordance with another embodiment of the invention, a MEMS stiction testing apparatus has a signal generator that when electrically connected with a MEMS device having two opposing surfaces is capable of applying a first electrical signal to the two opposing surfaces-thus causing the two opposing surfaces to make physical contact. The two opposing surfaces produce a second electrical signal when in physical contact. The apparatus also has a signal monitor operatively coupled with the first signal generator. The signal monitor is capable of detecting if the second electrical signal has reached a prescribed maximum value and substantially mitigating the first electrical signal after detecting that the second electrical signal has reached a prescribed maximum value.

Illustrative embodiments of the invention may be implemented as a computer program product having a computer usable medium with computer readable program code thereon. The computer readable code may be read and utilized by a computer system including, for example, certain programmable parametric analyzers, in accordance with conventional processes.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a testing apparatus forces together the surfaces of a MEMS device to test for stiction problems. Unlike related prior art techniques known to the inventors, however, the apparatus is not the source of any resulting stiction. To that end, the test apparatus produces a first signal (e.g., a voltage differential between the surfaces) to force the surfaces together, consequently causing generation of a second signal (e.g., a current flowing between the surfaces).

If not controlled, this second signal undesirably can cause the two surfaces to stick together. For example, a very high current can permanently weld the two surfaces together. Various embodiments therefore limit the magnitude of the second signal to substantially mitigate the possibility of the testing apparatus being the source of the stiction. Instead, if the surfaces do stick, then the source of that stiction is not from the testing apparatus. Details of illustrative embodiments are discussed below.

Figure 1:
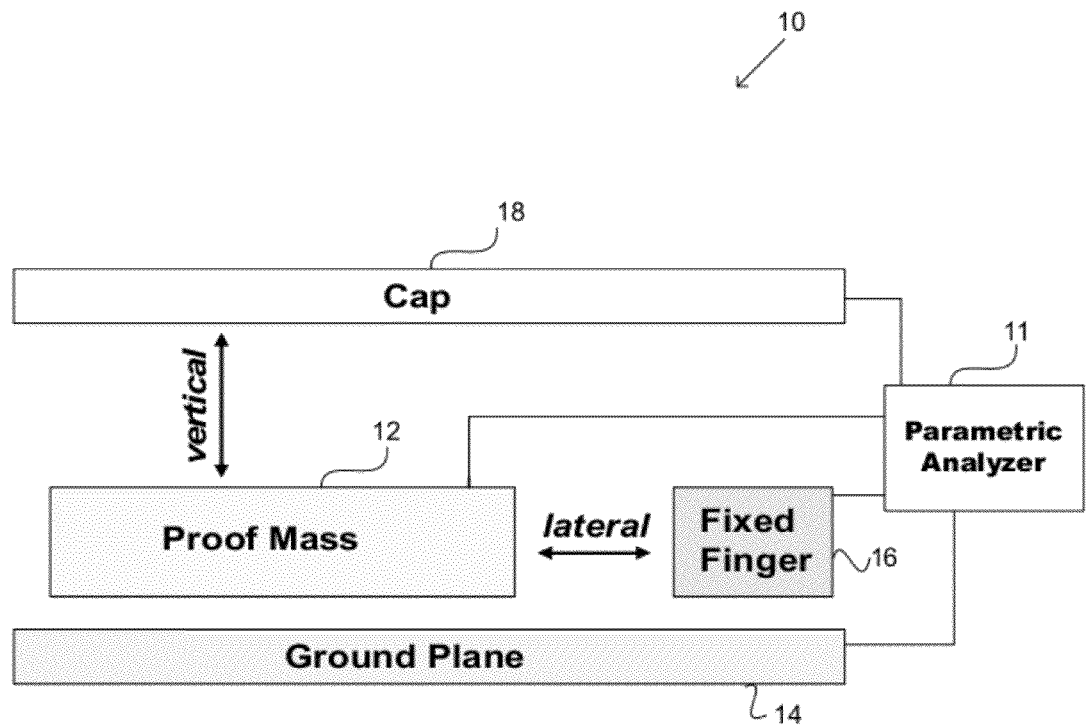
FIG. 1 schematically shows a MEMS device that is electrically connected with a parametric analyzer in accordance with illustrative embodiments of the invention.

FIG. 1 schematically and generically shows a MEMS device 10 electrically connected with a parametric analyzer 11 (i.e., a testing apparatus) in accordance with illustrative embodiments of the invention. Specifically, the MEMS device 10 has a proof mass 12 that is movably supported (e.g., via a number of springs) by a substrate/ground plane ("substrate 14"). The proof mass 12 is formed in a device plane that is substantially parallel to the substrate 14. The proof mass 12 may be wholly or partially movable out-of-plane (e.g., the proof mass 12 might be configured to move up-and-down in the vertical direction as shown in the figure or may be configured to tip about a central point) relative to the substrate 14 and to a cap 18 and/or may be movable (e.g., linearly along one or more axes, or rotationally) relative to a plurality of fixed fingers 16 that are adjacent (lateral) to the proof mass 12 in the device plane. The cap 18 covers the proof mass 12 and fingers 16 to form cavity that may be open (e.g., to allow sound waves to reach the proof mass 12 of a MEMS microphone) or may be sealed. It should be noted that the cap 18 and/or the fixed fingers 16 may be omitted from certain embodiments.

As known by those skilled in the art, the proof mass 12 may be capacitively coupled with the cap 18, with the substrate 14, and/or with the fixed fingers 16 so as to form one or more variable capacitors. The fixed fingers 16 may be used to drive movement of the proof mass 12 and/or to detect movement of the proof mass 12 in the device plane. The substrate 14 may include one or more electrodes, e.g., to sense vertical movements of the proof mass 12 and/or to apply out-of-plane forces on the proof mass 12.

For example, if the MEMS device 10 forms a gyroscope, then the fixed fingers 16 may be used to drive the proof mass 12 and/or detect movement of the proof mass, e.g., due to Coriolis forces. As another example, if the MEMS device 10 forms an accelerometer, then the fixed fingers 16 may simply detect mass movement. Exemplary MEMS gyroscopes are discussed in greater detail in U.S. Pat. No. 6,505,511, in U.S. Pat. No. 6,877,374, and in U.S. Pat. No. 5,635,640, which are assigned to Analog Devices, Inc. of Norwood, Mass. and are hereby incorporated herein by reference in their entireties. Exemplary MEMS accelerometers are discussed in greater detail in U.S. Pat. No. 5,939,633 and in U.S. Pat. No. 6,892,576, which also are assigned to Analog Devices, Inc. of Norwood, Mass. and are hereby incorporated herein by reference in their entireties.

Alternatively, if the MEMS device 10 forms a pressure sensor or microphone, then the proof mass 12 may be a diaphragm that is suspended so as to move up-and-down substantially in the vertical direction only and that is capacitively coupled with the cap 18 and/or the substrate 14 for sensing such vertical movements of the diaphragm. Such a device 10 may exclude the laterally-positioned fixed fingers 16. U.S. patent application publication number US2006/0237806, which is hereby incorporated by reference in its entirety, shows some exemplary MEMS microphones including a MEMS microphone in which the diaphragm is capacitively coupled with a bridge (cap) electrode (see, for example, FIG. 1) and a MEMS microphone in which the diaphragm is capacitively coupled with the substrate (see, for example, FIG. 2N).

If, on the other hand, the MEMS device 10 forms an optical switch, then the proof mass 12 may be a MEMS mirror that is capacitively coupled to one or more electrodes on the substrate 14 used to control the position of the mirror. Exemplary MEMS optical switches are discussed in greater detail in U.S. Pat. No. 6,940,636 and in U.S. Pat. No. 6,625,345, which are assigned to Analog Devices, Inc. of Norwood, Mass. and are hereby incorporated herein by reference in their entireties.

Embodiments of the present invention may include these and other types of MEMS devices having movable parts that are susceptible to stiction, such as, for example, electrometers (e.g., as described in U.S. Pat. No. 7,098,644, which is assigned to Analog Devices, Inc. of Norwood, Mass. and is hereby incorporated herein by reference in its entirety), flow sensors (e.g., as described in U.S. patent application publication number US2008/0264181, which is assigned to Analog Devices, Inc. of Norwood, Mass. and is hereby incorporated herein by reference in its entirety), position sensors (e.g., as described in U.S. Pat. No. 6,713,829, which is assigned to Analog Devices, Inc. of Norwood, Mass. and is hereby incorporated herein by reference in its entirety), switches, and RF devices, to name but a few.

In any case, the MEMS device 10 may be a MEMS-only device (i.e., with structure only), or an integrated MEMS having both structure and circuitry, such as an IMEMS™ inertial sensor distributed by Analog Devices, Inc. of Norwood, Mass. Moreover, the MEMS device 10 can have springs with high and/or low spring constants. For example, the MEMS device 10 can have very stiff springs for a high-G application (e.g., part of an automobile air-bag deployment system).

As noted above, surfaces of the proof mass 12 may stick with any surface it faces. For example, in the MEMS device 10 of FIG. 1, the proof mass 12 may stick with the substrate 14, the fixed fingers 16, and/or the cap 18. Accordingly, illustrative embodiments use a specially-adapted parametric analyzer 11 or other test apparatus to determine the likelihood of the proof mass 12 sticking to any of its adjacent surfaces. More specifically, the parametric analyzer 11 applies an electrical force to the proof mass 12 to force it toward one of the adjacent surfaces, e.g., by grounding the proof mass 12 and placing an appropriate voltage on the adjacent surface. In addition, the parametric analyzer 11 detects currents that may result from surface contact.

To those ends, the test apparatus (which in this example is a specially-adapted parametric analyzer 11 as discussed more fully below) electrically connects with the cap 18, the proof mass 12, and the fixed fingers 16. In addition, the parametric analyzer 11 also may electrically connect to the substrate 14 (e.g., to one or more electrodes disposed in or on the substrate and/or to the substrate itself). These electrical connections are bi-directional; namely, these connections both deliver and receive electrical signals from the various portions of the MEMS device 10. It should be noted that the MEMS device 10 would typically be fabricated with electrical paths to these components, and so the existing electrical paths may be used for stiction testing as described herein, or additional electrical paths may be included in the MEMS device 10 for stiction testing.

Any number of devices may be customized to perform the function of the parametric analyzer 11. Discussion of the specific parametric analyzer 11 therefore is for illustrative purposes only and not intended to limit various embodiments of the invention. As an example, the parametric analyzer 11 may be an Agilent B1500A Semiconductor Device Analyzer (distributed by Agilent Technologies Inc. of Santa Clara, Calif.) that is programmed to perform the testing functions discussed with regard to FIG. 2.

Figure 2:
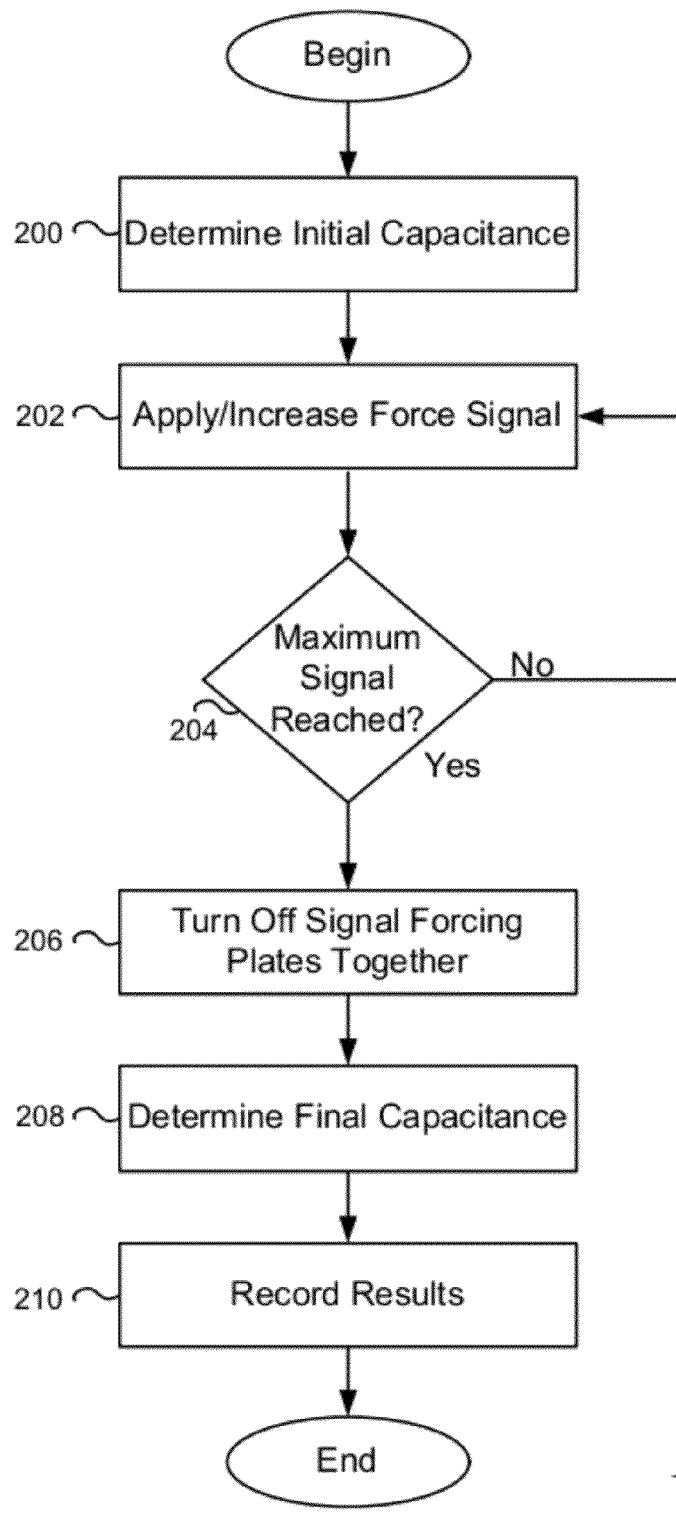
FIG. 2 shows a process of testing a MEMS device in accordance with illustrative embodiments of the invention.

FIG. 2 shows a process of testing the MEMS device 10 in accordance with illustrative embodiments of the invention. This process may be performed between the proof mass 12 and the structure on all of its sides. This process therefore may be repeated six times for a capped MEMS device 10 having fixed fingers 16 laterally spaced from four sides of the proof mass 12. Specifically, this process may be repeated once for each of the sets of fixed fingers 16, once for the cap 18, and once for the substrate 14. For purposes of discussion, the process of FIG. 2 is discussed as being performed between the proof mass 12 and the cap 18. Of course, as noted above, this process may be repeated for other structures within the MEMS device 10, e.g., for individual electrodes on the substrate 14 underlying the proof mass 12 or for separate groups of fixed fingers 16 operating along different axes or in different directions.

The process begins at step 200, which determines an initial capacitance between the proof mass 12 and the cap 18. This initial capacitance reading is taken before the parametric analyzer 11 applies an attracting voltage between the two structures. Capacitance measurement techniques are known in the art, and the capacitance measurement may be performed using the existing capacitance measurement capabilities of the parametric analyzer 11 (e.g., the Agilent B1500A Semiconductor Device Analyzer has integrated capacitance measurement capabilities).

To determine if the two surfaces will stick together, they must be brought into direct contact. The process thus continues to step 202, which applies a force that brings the plates together. To that end, the process applies a voltage between the proof mass 12 and the cap 18 in discrete increments (e.g., in increments of 0.1 volts). This voltage signal is in lieu of a mechanical signal, such as a physical inertial signal produced by an inertial simulation device, such as a shaker.

After applying the first incremental voltage, the parametric analyzer 11 determines if it can detect a prescribed maximum current between the proof mass 12 and the cap 18 (step 204). No current should flow between the proof mass 12 and the cap 18 if they do not physically contact. Accordingly, by determining if the maximum current flows between the surfaces, step 204 effectively determines if the two plates are in contact.

This prescribed maximum current may be selected based upon a number of different variables. Among other things, the maximum current should be low enough so that it does not create stiction. In other words, the maximum current should be low enough to not effectively weld the proof mass 12 to the cap 18. Nevertheless, this maximum current should be high enough for the parametric analyzer 11 to be capable of reading. While testing a specific MEMS device 10, to meet the testing requirements, the inventors determined that about 500 picoamps was an appropriate maximum current. Other embodiments, however, may select other values based upon the specifics of the testing process and MEMS device 10. For example, such embodiments may use maximum currents of between about 300 and 700 picoamps.

Figure 3:
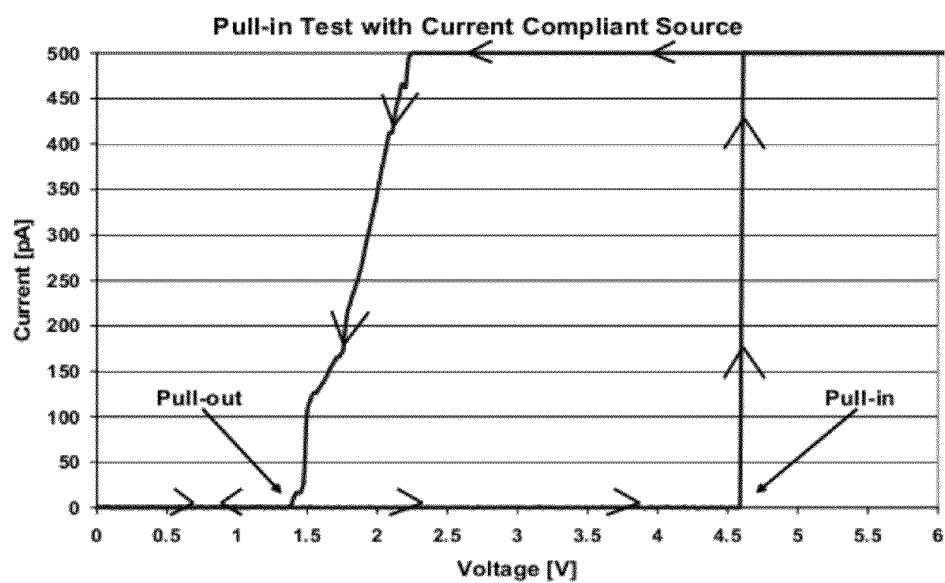
FIG. 3 schematically shows a first hysteresis curve produced when using the process of FIG. 2.

If the parametric analyzer 11 does not detect the maximum current, then the process loops back to step 202, which applies the next incremental step voltage. This loop continues between steps 202 and 204 until the parametric analyzer 11 detects the maximum current. FIG. 3 graphically shows one example in which the voltage increments up to about 4.6 volts before the current reaches 500 picoamps. As shown in that figure, the voltage effectively steps from zero to the maximum current between about 4.5 volts and 4.6 volts. It is at this point that pull-in (i.e., contacting of the two surfaces) of the proof mass 12 is considered to occur.

The process then continues to step 206, which substantially mitigates the force that caused the proof mass 12 to contact the cap 18. In this case, the method turns off the voltage completely. In other embodiments, the method may reduce the voltage to a significantly lower value without completely turning off the voltage. In alternative embodiments, the voltage is very rapidly stepped down to a low voltage.

Figure 5:
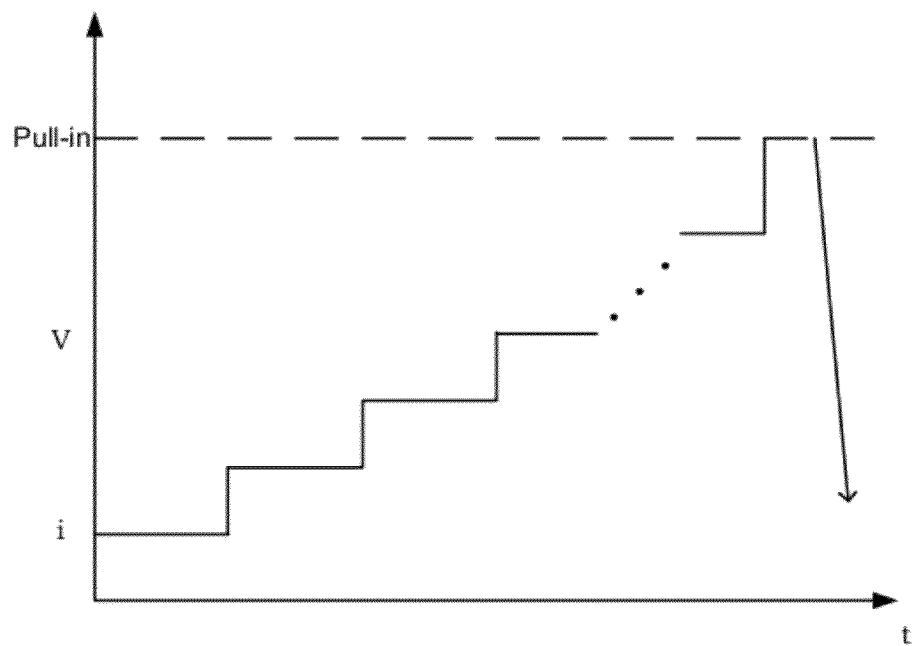
FIG. 5 is a schematic diagram showing a representation of a force signal having an incremental step-up, in accordance with the process of FIG. 2.
Figure 6:
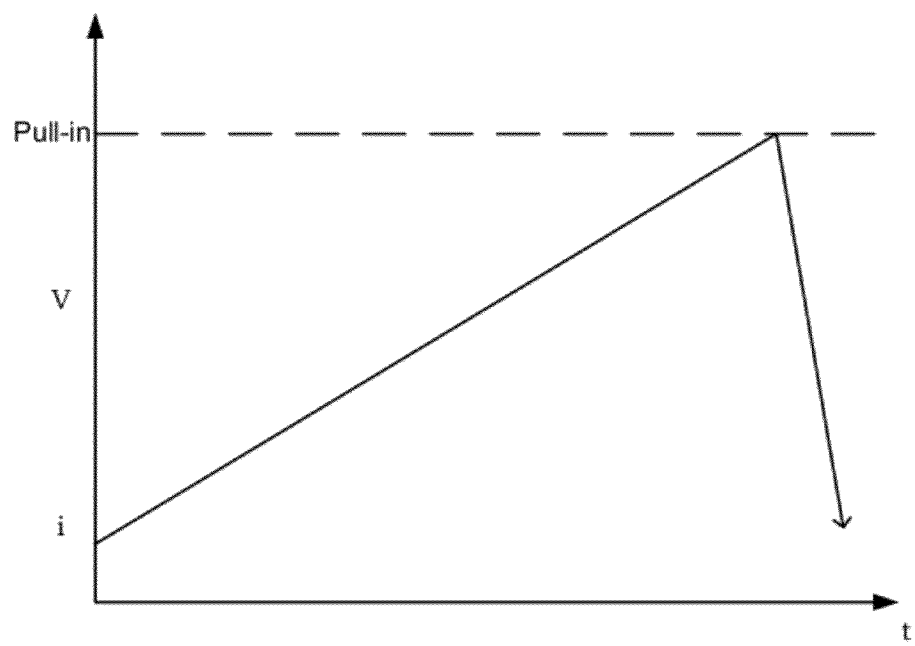
FIG. 6 is a schematic diagram showing a representation of a force signal that increases linearly, in accordance with one alternative embodiment.
Figure 7:
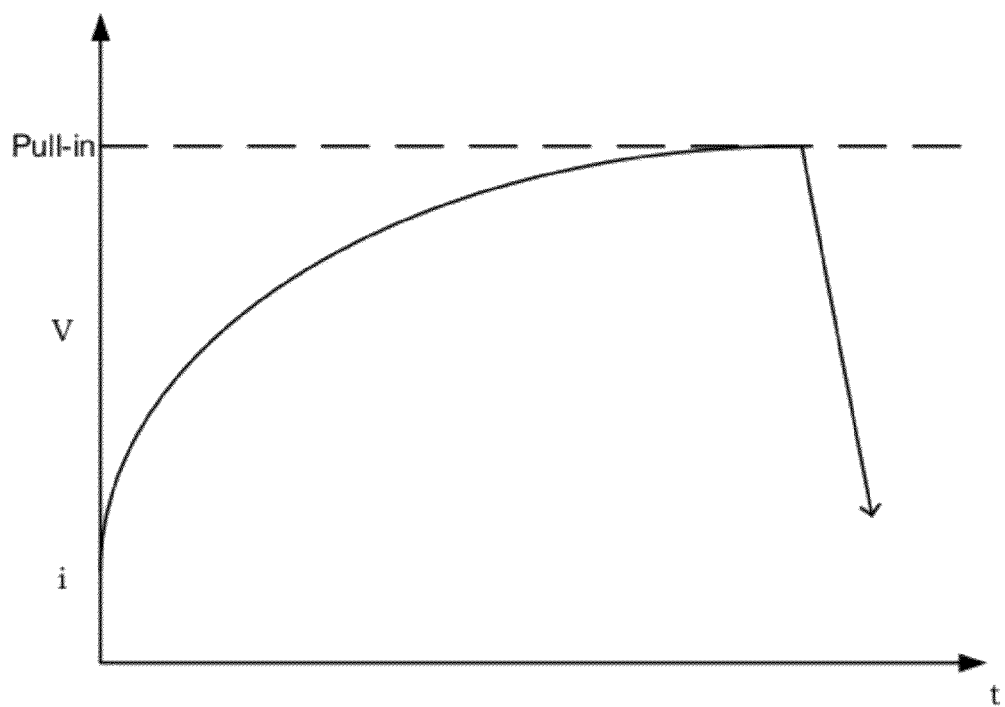
FIG. 7 is a conceptual diagram showing a representation of a force signal that increases non-linearly, in accordance with another alternative embodiment.

FIG. 5 is a schematic diagram showing a representation of the force signal having an incremental step-up, in accordance with this exemplary embodiment. Starting with an initial voltage (i), the voltage is increased in discrete steps (e.g., at regular time intervals) until pull-in is detected, at which time, the voltage is quickly reduced. It should be noted that other voltage curves may be used in alternative embodiments of the present invention. For example, the voltage may be increased on a continuum either linearly, as depicted in FIG. 6, or non-linearly, as depicted in FIG. 7.

If the proof mass 12 did not stick to the cap 18, then the capacitance between the proof mass 12 and the cap 18 should be substantially the same as that determined at step 200. Accordingly, the process continues to step 200, which determines the final capacitance between the proof mass 12 and the cap 18. If this measured capacitance is substantially the same as the value determined at step 200, then it may be reasonably concluded that the proof mass 12 did not stick to the cap 18. Conversely, if the capacitance reading is substantially higher than that of the initial reading, then it may be reasonably concluded that the proof mass 12 did stick to the cap 18.

In either case, the results of the test may be recorded (step 210). If the proof mass 12 did stick to the cap 18, then further action may be taken to both determine the source of the stiction, and remove or mitigate that source from the process fabricating the MEMS device 10. For example, one skilled in the art may add a texture to the surface of the proof mass 12 to reduce the likelihood of stiction in subsequently fabricated MEMS devices. Among other things, this test should facilitate stiction detection in lot-to-lot variations and within-wafer variations.

The following is exemplary pseudocode for the process described above with reference to FIG. 2, where "test_cap( )" is a pseudofunction for measuring the capacitance between the proof mass and an adjacent structure using the inherent capacitance measurement capabilities of the parametric analyzer 11, "apply( )" is a pseudofunction for applying a specified voltage using inherent voltage generation capabilities of the parametric analyzer 11, "measure_current( )" is a pseudofunction for measuring current between the proof mass and the adjacent structure using inherent current measurement capabilities of the parametric analyzer 11, and "record( )" is a pseudofunction for recording the result of the test:

```
initial_capacitance = test_cap( );
for (test_voltage = 0; test_voltage <= MAX_VOLTAGE;
test_voltage += 0.1)
{
   apply(test_voltage);          /* apply test voltage       */
   current = measure_current( ); /* measure current          */
   if (current >= MAX_CURRENT)   /* if max current detected  */
   {
      apply(0);                  /* turn off voltage         */
      break;                     /* break out of the loop    */
   }
}
final_capacitance = test_cap( );
if (final_capacitance == initial_capacitance)
   record(pass);
else
   record(fail);
```

In this exemplary pseudocode, the test voltage steps up from an initial value of 0V in 0.1V increments until either the measured current reaches the predetermined maximum (MAX_CURRENT) indicating that pull-in occurred or the test voltage exceeds a predetermined maximum voltage (MAX_VOLTAGE). It should be noted that the initial voltage may be non-zero in some embodiments, and the maximum voltage may be a limit of the parametric analyzer or may be set to a predetermined value. It also should be noted that the pass/fail determination has been simplified here for convenience; in typical embodiments, the final capacitance generally would be allowed to vary from the initial capacitance by some amount (e.g., plus or minus a predetermined percentage).

Figure 4:
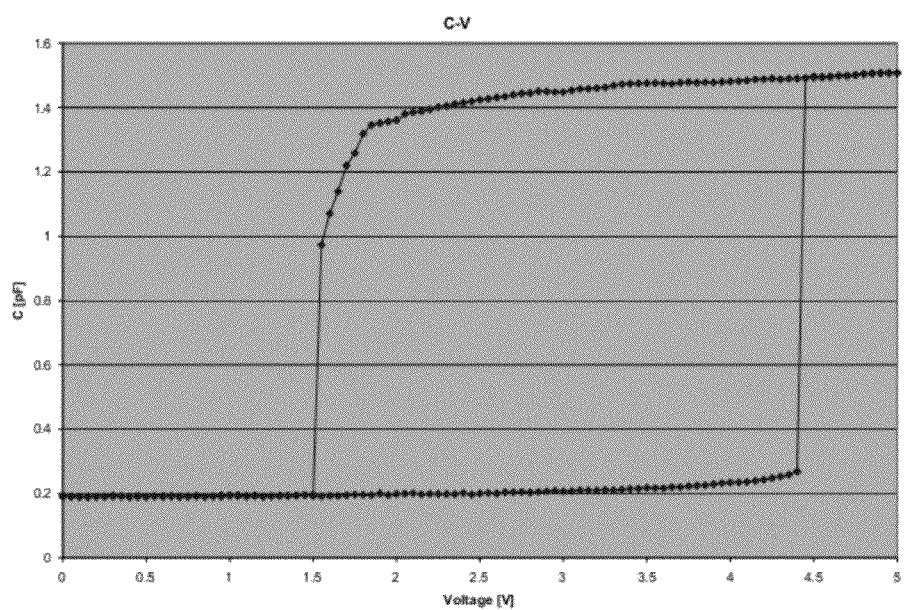
FIG. 4 schematically shows a second hysteresis curve produced when using the process of FIG. 2.

The MEMS device 10 tested in FIG. 3 had a pullout voltage (i.e., the voltage when the proof mass 12 returns to its rest position) of about 1.3 volts. FIG. 4 schematically shows a similar graphical representation of the test. Specifically, FIG. 4 graphically shows the varying capacitance between the surfaces as a function of voltage. In a manner similar to the waveform of FIG. 3, the capacitance remains relatively low (e.g., about 0.2 picofarads) until a pull-in voltage of just under about 4.5 volts. At that point, the capacitance increases to about 1.5 picofarads. If the voltage is increased to 5V, the capacitance generally remains substantially unchanged, only slightly increasing. As the voltage decreases, the capacitance reduces very slowly until just under about two volts. At that point, the capacitance starts to drop very rapidly to about 0.2 picofarads as the voltage decreases.

Alternative embodiments of the present invention may continue to measure the current as the force voltage is decreased in order to look for the pull-out condition and measure the approximate voltage at which pull-out occurs. For example, after detecting the pull-in condition, the current may be measured as the force voltage is reduced (e.g., in discrete steps or otherwise) until the current reaches zero. If the current reaches zero with a non-zero force voltage, then pull-out has likely occurred. If, on the other hand, the current does not reach zero until the force voltage is at zero, then pull-out may or may not have occurred. The pull-in and/or pull-out voltages may be recorded along with other test results.

The following is exemplary pseudocode for an alternative embodiment including both pull-in and pull-out detection:

```
initial_capacitance = test_cap( );
for (test_voltage = 0; test_voltage <= MAX_VOLTAGE;
test_voltage += 0.1)
{
   apply(test_voltage);          /* apply test voltage       */
   current = measure_current( ); /* measure current          */
   if (current >= MAX_CURRENT)   /* if max current detected  */
      break;                     /* break out of the loop    */
}
record(test_voltage);            /* record pull-in voltage   */
for (test_voltage -= 0.1; test_voltage >= 0; test_voltage -+ 0.1)
{
   apply(test_voltage);          /* apply reduced test voltage */
   current = measure_current( ); /* measure current            */
   if (current == 0)             /* if current reaches zero    */
      break;                     /* break out of the loop      */
}
record(test_voltage);            /* record pull-out voltage  */
final_capacitance = test_cap( );
if (final_capacitance == initial_capacitance)
   record(pass);
else
   record(fail);
```

In this exemplary pseudocode, the test voltage steps up from an initial value of 0V in 0.1V increments until either the measured current reaches the predetermined maximum (MAX_CURRENT) indicating that pull-in occurred or the test voltage exceeds a predetermined maximum voltage (MAX_VOLTAGE). It should be noted that the initial voltage may be non-zero in some embodiments, and the maximum voltage may be a limit of the parametric analyzer or may be set to a predetermined value. It also should be noted that the pass/fail determination has been simplified here for convenience; in typical embodiments, the final capacitance generally would be allowed to vary from the initial capacitance by some amount (e.g., plus or minus a predetermined percentage).

Figure 8:
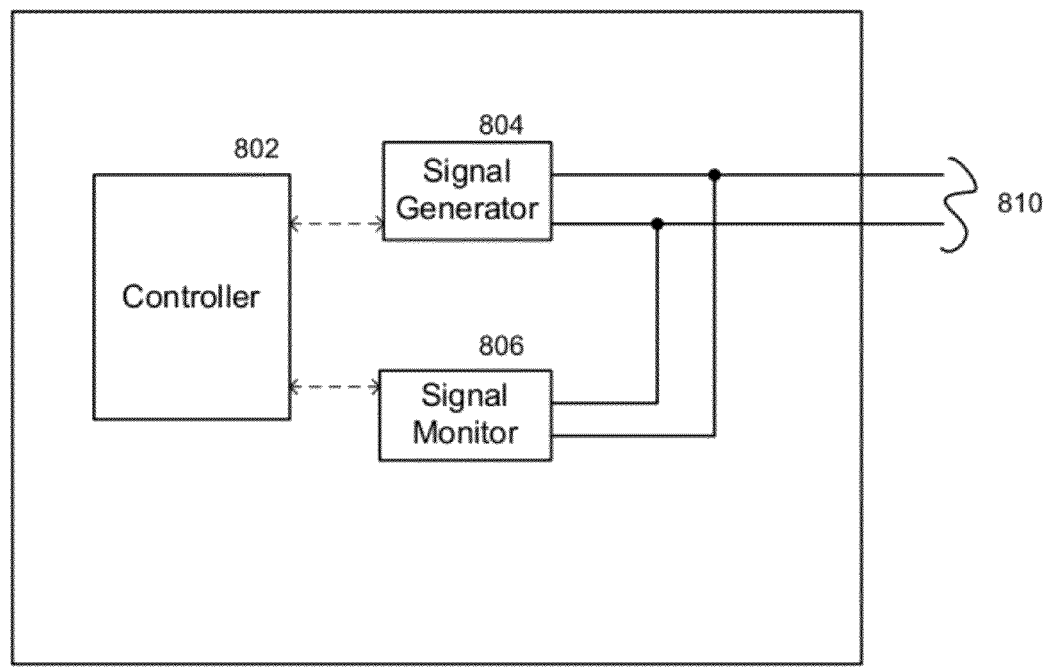
FIG. 8 is a schematic block diagram showing relevant components of a MEMS stiction testing apparatus in accordance with illustrative embodiments of the invention.

FIG. 8 is a schematic block diagram showing relevant components of the parametric analyzer test apparatus 11 in accordance with illustrative embodiments of the invention. Among other things, the spectrum analyzer test apparatus 11 includes a controller 802, a signal generator 804, and a signal monitor 806. In this exemplary embodiment, the signal generator 804 is configured or otherwise operated by the controller 802 to apply, via interface 810, a first electrical signal to a MEMS device-under-test (DUT) having two opposing surfaces to cause the two opposing surfaces to make physical contact and produce a second electrical signal. The signal monitor 806 is configured or otherwise operated by the controller 802 to monitor the second signal and provide readings to the controller 802, which detects when the second electrical signal has reached a prescribed maximum value and then substantially mitigates the first signal, for example, by causing the signal generator 804 to completely turn off the first signal or to reduce the first signal in a stepped manner. The controller 802 may control the timing and/or step size for applying the first signal and also may control the timing and/or step size for reducing the first signal.

In certain embodiments, the signal generator 804 and/or the signal monitor 806 may be configured to perform some or all of the functions described for the controller 802, e.g., in hardware or otherwise. Thus, for example, certain embodiments may be considered to include a signal generator configured to apply the first electrical signal and a signal monitor configured to substantially mitigate the first electrical signal after detecting that the second signal has reached the prescribed maximum value. In various alternative embodiments, additional components may be included, such as, for example, an external switch (not shown) coupled between the signal generator 804 and the interface 810 and operated by the controller 802, the signal generator 804, or the signal monitor 806 to turn off the first signal when the second signal reaches the prescribed maximum value.

The MEMS device 10 shown and described above with reference to FIG. 1 includes a proof mass, a substrate, a cap, and a plurality of fixed fingers. As discussed above, some of these structures may be omitted from certain embodiments. For example, a MEMS microphone or pressure sensor may lack fixed fingers for sensing movement of the proof mass in the device plane, and MEMS devices may be uncapped. On the other hand, MEMS devices may include other types of structures that are susceptible to stiction, including, for example, various types of electrodes used for such things as offset error correction and self-test, and it should be noted that the apparatus and methods described herein may be applied to these additional structures. Also, a MEMS device may include multiple proof mass systems, where a proof mass system includes a movable mass and one or more adjacent structures susceptible to stiction, and it should be noted that the apparatus and methods described herein may be applied to each of these systems. By way of example, U.S. Pat. No. 6,877,374, which is hereby incorporated by reference in its entirety, describes a MEMS gyroscope that includes, among other things, multiple resonator masses with corresponding fixed drive electrodes for linearly moving the masses, an outer frame with corresponding fixed sense electrodes for sensing rotational movement of the frame, and various other masses and electrodes (e.g., levers with corresponding fixed drive/sense electrodes and quadrature adjusting electrodes), and the apparatus and methods described herein may be applied to each of these systems separately. For example, stiction of the outer frame (e.g., between the frame and the sensing fingers) may be tested independently of resonator mass stiction (e.g., between the masses and the underlying substrate).

In the embodiments described above, stiction testing is performed by applying a voltage between the proof mass 12 and an adjacent structure and checking for a current flowing between the two components. It should be noted, however, that stiction testing could be performed by applying appropriate voltages between the proof mass 12 and two or more adjacent structures simultaneously and mitigating the voltages when the current in any of the pairings reaches the maximum. Thus, for example, stiction testing could be performed by applying appropriate voltages between the proof mass 12 and both the substrate 14 and fixed fingers 16 simultaneously, or between the proof mass 12 and both the cap 18 and the fixed fingers 16 simultaneously, or between different sets of fixed fingers 16 simultaneously (e.g., two sets of fixed fingers operating in different axes or directions), or between the proof mass 12 and different sets of electrodes on the substrate 14 (e.g., to exert an out-of-plane torque on the proof mass 12), to name but a few possible combinations. The same voltage could be applied to multiple structures, or the voltages applied to different structures could be controlled separately and could be varied separately (e.g., place an initial voltage on structure A and then step through a range of voltages on structure B, then step up the voltage on structure A and repeat the range of voltages on structure B, etc.).

It should be noted that the term "proof mass" is used herein generally to describe a movable component of a MEMS device that may be susceptible to stiction and the present invention is not limited to any particular type of movable MEMS component. A movable component may be designed specifically to be movable (e.g., an accelerometer proof mass, a gyroscope resonator or frame, a microphone diaphragm, etc.) or may be movable in the presence of certain forces (e.g., an elongated fixed finger 16 may bend and therefore may be susceptible to stiction with the substrate 14 and/or the cap 18). Embodiments of the present invention may test such components for stiction.

It should be noted that the apparatus and methods described above may be used to test for and/or infer other conditions that may or may not relate to stiction, and the logic flow shown in FIG. 2 may be modified or adapted accordingly. The following are some examples:

EXAMPLE 1

If current is detected when determining the initial capacitance (e.g., at step 200 in FIG. 2) or at the lowest test voltage (e.g., at step 202 in FIG. 2), then the two surfaces already may be in contact with one another (e.g., due to stiction, fabrication defect, or breakage) or another failure condition may exist (e.g., a short circuit). The logic flow of FIG. 2 could be modified to proceed directly to block 210 if such a condition exists.

EXAMPLE 2

If a predetermined maximum test voltage (force) is reached without detecting the maximum current, then the movable part may be stuck or impeded (e.g., due to stiction elsewhere, incomplete release of the movable part, springs that are too stiff, or other defect or impediment). The logic flow of FIG. 2 could be modified to terminate the loop between blocks 202 and 204 and proceed to block 210 if a maximum force signal is reached without detecting contact between the test surfaces.

EXAMPLE 3

Even if a MEMS device passes the stiction test (i.e., the surfaces are forced together and then separate properly), the MEMS device still may be considered defective or unsuitable for a particular purpose. For example, if a larger or smaller than expected test voltage is needed to force the surfaces together (e.g., due to springs that are too stiff or too pliable), the MEMS device may be flagged as being defective or suspect. The logic flow of FIG. 2 could be modified to record an appropriate device status if contact is detected at a force signal that is above or below a predetermined force signal threshold.

Thus, it should be noted that the process of FIG. 2 is but one of many different processes that can implement illustrative embodiments of the invention. For example, some processes affirmatively measure and record the pullout voltage. Such processes often use this pullout voltage (which is a function of stiction) to further optimize the MEMS fabrication process. Such processes therefore can limit the current between the contacting surfaces to maximum value, thus eliminating a false source of stiction (i.e., the electrical signals of the testing process).

It also be noted that although voltage and current are discussed, various other embodiments may use other electrical signals to detect stiction. Accordingly, discussion of current and voltage is for illustrative purposes only.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

In an alternative embodiment, the disclosed apparatus and methods (e.g., see the various flow charts described above) may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be a tangible medium (e.g., optical or analog communications lines). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS stiction testing method comprising:
measuring the capacitance between the two opposing surfaces of a MEMS device prior to applying a first electrical signal;
applying the first electrical signal to the MEMS device, the first electrical signal causing the two opposing surfaces to make physical contact, the two opposing surfaces producing a second electrical signal when in physical contact;
monitoring the second electrical signal;
substantially mitigating the first electrical signal after detecting that the second electrical signal has reached a prescribed maximum value;
measuring the capacitance between the two opposing surfaces after substantially mitigating the first electrical signal; and
comparing the capacitance measurement from after substantially mitigating the first electrical signal with the capacitance measurement from prior to applying the first electrical signal.

2. The method as defined by claim 1 wherein applying the first electrical signal to the MEMS devices comprises applying the first electrical signal to the MEMS device in a stepped manner.

3. The method as defined by claim 1 wherein substantially mitigating comprises one of:
completely turning off the first electrical signal; or
reducing the first electrical signal in a stepped manner.

4. The method as defined by claim 1 wherein the opposed surfaces separate at a given signal level while mitigating the first electrical signal, the method further comprising at least one of:
monitoring the second electrical signal to detect when the second electrical signal has reached a prescribed value indicative of surface separation; or
recording the given signal level.

5. The method as defined by claim 1 wherein the first electrical signal is a voltage, and the second electrical signal is a current.

6. The method as defined by claim 1 wherein the prescribed maximum value is between about 300 and 700 pico-amps.

7. The method as defined by claim 1 wherein the two opposing surfaces form a variable capacitor.

8. The method as defined by claim 1 wherein the MEMS device includes at least one of:
a high-G MEMS inertial sensor;
a low-G MEMS inertial sensor; or
a MEMS microphone.

9. A MEMS stiction testing apparatus comprising:
a signal generator configured to provide a first electrical signal that when applied to a MEMS device having two opposing surfaces causes the two opposing surfaces to make physical contact, the two opposing surfaces producing a second electrical signal when in physical contact; and
a signal monitor configured to measure the capacitance between the two opposing surfaces prior to the signal generator applying the first electrical signal, monitor the second electrical signal, substantially mitigate the first electrical signal after detecting that the second electrical signal has reached a prescribed maximum value, measure the capacitance between the two opposing surfaces after substantially mitigating the first electrical signal, and compare the capacitance measurement from after substantially mitigating the first electrical signal with the capacitance measurement from prior to applying the first electrical signal.

10. The apparatus as defined by claim 9 wherein the signal generator is configured to provide the first electrical signal in a stepped manner.

11. The apparatus as defined by claim 9 wherein the signal monitor is configured to substantially mitigate the first electrical signal by one of:
completely turning off the first electrical signal; or
reducing the first electrical signal in a stepped manner.

12. The apparatus as defined by claim 9 wherein the opposed surfaces separate at a given signal level while mitigating the first electrical signal, and wherein the signal monitor is further configured to at least one of:

monitor the second electrical signal to detect when the second electrical signal has reached a prescribed value indicative of surface separation; or record the given signal level.

13. The apparatus as defined by claim 9 wherein the first electrical signal is a voltage, and the second electrical signal is a current.

14. The apparatus as defined by claim 9 wherein the prescribed maximum value is between about 300 and 700 pico-amps.

15. The apparatus as defined by claim 9 wherein the two opposing surfaces form a variable capacitor.

16. The apparatus as defined by claim 9 wherein the apparatus is a programmable parametric analyzer.

17. The apparatus as defined by claim 9 wherein the MEMS device includes at least one of:

a high-G MEMS inertial sensor;

a low-G MEMS inertial sensor; or a MEMS microphone.

18. A computer program product for use on a computer system for MEMS stiction testing, the computer program product comprising a tangible non-transitory computer usable medium having computer readable program code thereon, the computer readable program code comprising:

program code for instructing a computer system for MEMS stiction testing to measure the capacitance between two opposing surfaces of a MEMS device prior to applying a first electrical signal;

program code for instructing the computer system to apply the first electrical signal to MEMS device, the electrical signal causing the two opposing surfaces to make physical contact, the two opposing surfaces producing a second electrical signal when in physical contact;

program code for instructing the computer system to monitor the second electrical signal;

program code for instructing the computer system to substantially mitigate the first electrical signal after detecting that the second electrical signal has reached a prescribed maximum value;

program code for instructing the computer system to measure the capacitance between the two opposing surfaces after substantially mitigating the first electrical signal; and program code for instructing the computer system to compare the capacitance measurement from after substantially mitigating the first electrical signal with the capacitance measurement from prior to applying the first electrical signal.

* * * * *